(12) United States Patent
Nakamura

(10) Patent No.: US 7,188,289 B2
(45) Date of Patent: Mar. 6, 2007

(54) TEST CIRCUIT AND CIRCUIT TEST METHOD

(75) Inventor: Yoshiyuki Nakamura, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 168 days.

(21) Appl. No.: 11/081,619

(22) Filed: Mar. 17, 2005

(65) Prior Publication Data
US 2005/0210351 A1    Sep. 22, 2005

(30) Foreign Application Priority Data
Mar. 19, 2004   (JP)   ............... 2004-080631

(51) Int. Cl.
*G01R 31/28* (2006.01)
(52) U.S. Cl. ............ 714/733; 714/731; 714/744
(58) Field of Classification Search ........... 368/120; 365/233, 201; 714/7, 733, 731, 744; 324/765
See application file for complete search history.

(56) References Cited
U.S. PATENT DOCUMENTS 5,867,453 A * 2/1999 Wang et al. ............ 368/120
5,875,153 A * 2/1999 Hii et al. ............... 365/233
6,347,056 B1 * 2/2002 Ledford et al. .......... 365/201
6,421,789 B1 * 7/2002 Ooishi ....................... 714/7
6,442,722 B1 * 8/2002 Nadeau-Dostie et al. ... 714/731
6,583,642 B2 * 6/2003 Huang et al. ............. 324/765
6,760,865 B2 * 7/2004 Ledford et al. ........... 714/30
7,000,164 B2 * 2/2006 Siegel et al. ............. 714/731
7,114,113 B2 * 9/2006 Yonaga et al. ............ 714/744

FOREIGN PATENT DOCUMENTS

JP   2004-107412   4/2002
JP   2003-36694 A  2/2003

* cited by examiner

*Primary Examiner*—David Ton
(74) *Attorney, Agent, or Firm*—Sughrue Mion, PLLC

(57) ABSTRACT

The test circuit tests a test target circuit and outputs a test result to a tester. The test circuit includes a first clock generator, a second clock generator, a test target circuit, a BIST circuit for performing the test, and a tester synchronous circuit. The BIST circuit repeats the test the number of times determined by the first clock and the second clock. The tester synchronous circuit selects a test result so as to output all the test results from the BIST circuit and outputs the selected test result.

13 Claims, 9 Drawing Sheets

Fig. 3

| OPERATION CLOCK CYCLE | 0 | 1 | 2 | 3 | 4 | 5 | 6 | 7 | 8 | ... | 124 | 125 | 126 | 127 |
|---|---|---|---|---|---|---|---|---|---|---|---|---|---|---|
| TEST RESULT | OK | OK | FAIL | OK | OK | OK | OK | FAIL | OK | | OK | OK | OK | OK |
| TESTER | OK | - | - | OK | - | - | OK | - | - | | - | - | OK | - |

Fig. 4A FIRST PATTERN

| OPERATION CLOCK CYCLE | 0 | 1 | 2 | 3 | 4 | 5 | 6 | 7 | 8 | ... | 124 | 125 | 126 | 127 |
|---|---|---|---|---|---|---|---|---|---|---|---|---|---|---|
| TEST RESULT | OK | OK | FAIL | OK | OK | OK | OK | FAIL | OK | ... | OK | OK | OK | OK |
| TESTER | OK | – | – | OK | – | – | OK | – | – | ... | – | – | OK | – |

Fig. 4B SECOND PATTERN

| OPERATION CLOCK CYCLE | 0 | 1 | 2 | 3 | 4 | 5 | 6 | 7 | 8 | ... | 124 | 125 | 126 | 127 |
|---|---|---|---|---|---|---|---|---|---|---|---|---|---|---|
| TEST RESULT | OK | OK | FAIL | OK | OK | OK | OK | FAIL | OK | ... | OK | OK | OK | OK |
| TESTER | – | OK | – | – | OK | – | – | FAIL | – | ... | – | OK | – | – |

Fig. 4C THIRD PATTERN

| OPERATION CLOCK CYCLE | 0 | 1 | 2 | 3 | 4 | 5 | 6 | 7 | 8 | ... | 124 | 125 | 126 | 127 |
|---|---|---|---|---|---|---|---|---|---|---|---|---|---|---|
| TEST RESULT | OK | OK | FAIL | OK | OK | OK | OK | FAIL | OK | ... | OK | OK | OK | OK |
| TESTER | – | – | FAIL | – | – | OK | – | – | OK | ... | – | OK | – | – |

Fig. 6A

OFFSET INPUT=0

| OPERATION CLOCK CYCLE | 0 | 1 | 2 | 3 | 4 | 5 | 6 | 7 | 8 | ... | ... | 124 | 125 | 126 | 127 |
|---|---|---|---|---|---|---|---|---|---|---|---|---|---|---|---|
| TEST RESULT | OK | OK | FAIL | OK | OK | OK | OK | FAIL | OK | ... | ... | OK | OK | OK | OK |
| TESTER | OK | - | - | - | - | - | OK | - | - | ... | ... | - | - | OK | - |

Fig. 6B

OFFSET INPUT=1

| OPERATION CLOCK CYCLE | 0 | 1 | 2 | 3 | 4 | 5 | 6 | 7 | 8 | ... | ... | 124 | 125 | 126 | 127 |
|---|---|---|---|---|---|---|---|---|---|---|---|---|---|---|---|
| TEST RESULT | OK | OK | FAIL | OK | OK | OK | OK | FAIL | OK | ... | ... | OK | OK | OK | OK |
| TESTER | - | OK | - | - | OK | - | - | - | OK | ... | ... | OK | - | - | OK |

Fig. 6C

OFFSET INPUT=2

| OPERATION CLOCK CYCLE | 0 | 1 | 2 | 3 | 4 | 5 | 6 | 7 | 8 | ... | ... | 124 | 125 | 126 | 127 |
|---|---|---|---|---|---|---|---|---|---|---|---|---|---|---|---|
| TEST RESULT | OK | OK | FAIL | OK | OK | OK | OK | FAIL | OK | ... | ... | OK | OK | OK | OK |
| TESTER | - | - | FAIL | - | - | OK | - | - | OK | ... | ... | - | OK | - | - |

Fig. 9

TEST END SIGNAL=0

| OPERATION CLOCK | 0 | 1 | 2 | 3 | 4 | 5 | 6 | 7 | 8 | ... | 124 | 125 | 126 | 127 |
|---|---|---|---|---|---|---|---|---|---|---|---|---|---|---|
| TEST RESULT | OK | OK | FAIL | OK | OK | OK | OK | FAIL | OK | ... | OK | OK | OK | OK |
| TESTER | OK | - | - | OK | - | - | OK | - | - | ... | - | - | - | - |

TEST END SIGNAL=1

| 128 | 129 | 130 | 131 | 132 | ... |
|---|---|---|---|---|---|
| FAIL | FAIL | FAIL | FAIL | FAIL | ... |
| - | FAIL | - | - | - | ... |

TEST CIRCUIT AND CIRCUIT TEST METHOD

BACKGROUND OF THE INVENTION

1. Field of the Invention

The present invention relates to test circuits and circuit test methods, and particularly to a built-in self-test circuit and a circuit test method which can identify exact time of failure occurrence at high clock frequency.

2. Description of Related Art

One of known test circuit for a system large-scale integrated circuit (LSI) is a built-in self-test (BIST) circuit, which is a test circuit incorporated into LSI. This configuration has the advantage of checking the operations when completing the circuit. Thus, test circuits with various techniques have been proposed.

For example, Japanese Unexamined Patent Application Publication No. 2003-36694 (Fujiwara et al.) describes a BIST circuit. In this technique, a test circuit includes a defect accumulation section and stores test result information output from the BIST circuit into the defect accumulation section, thereby allowing retrieval of the test result information as needed after performing the test.

Japanese Unexamined Patent Application Publication No. 2002-107412 (Nakamura) describes another technique. This technique does not accumulate comparison results but calculates and outputs OR. It allows, upon output of a failure result, identifying where the failure occurs by the clock cycle at that time.

However, the present invention has recognized that the above techniques have the following disadvantages. The technique taught by Fujiwara et al. requires a large capacity of memory in order to store test result information, which results in a high chip cost. If the memory capacity is small, the memory cannot store sufficient information and fails to determine where a test failure occurs. The technique taught by Nakamura imposes the restriction that the clock frequency of a test circuit has to be within the range of the clock frequency of a tester in order to observe all the clock cycles. It is thus necessary to increase the tester clock frequency if the clock frequency of the test circuit is high.

Further, most of prior BIST techniques only check the circuit good or bad and they do not identify exact time (clock cycle) of failure occurrence which is mandatory information for failure analysis.

SUMMARY OF THE INVENTION

According to one aspect of the present invention, there is provided a test circuit for testing a test target circuit and outputting a test result to a tester, including a test target circuit; a built-in self-test (BIST) circuit connected to the test target circuit and performing a test of the test target circuit; a first clock generator supplying a first clock to the test target circuit and the BIST circuit; a tester synchronous circuit receiving a test result from the BIST circuit and outputting the test result in synchronization with the tester; and a second clock generator supplying a second clock with a lower frequency than the first clock to the tester synchronous circuit. In this test circuit, the BIST circuit repeats the test the number of times determined by the first clock and the second clock, and the tester synchronous circuit selects and outputs a test result so as to output all test results from the BIST circuit. This configuration allows performing testing for all clock cycles without lowering the operation clock frequency.

According to another aspect of the present invention, there is provided a test circuit for testing a test target circuit and outputting a test result to a tester, including a test target circuit; a built-in self-test (BIST) circuit connected to the test target circuit and performing a test of the test target circuit; a clock generator supplying a clock to the test target circuit and the BIST circuit; and a tester synchronous counter counting the clock supplied from the clock generator and selecting and outputting a test result so as to output all test results from the BIST circuit. In this test circuit, the BIST circuit repeats the test the number of times determined by the clock of the BIST circuit and a clock of the tester. This configuration allows performing testing for all clock cycles without lowering the operation clock frequency.

According to still another aspect of the present invention, there is provided a circuit test method for testing a test target circuit, including supplying a first clock from a first clock generator to a test target circuit and a test execution circuit; supplying a second clock with a lower frequency than the first clock from a second clock generator to a tester synchronous circuit; performing by the test execution circuit a test of the test target circuit and outputting a test result to the tester synchronous circuit; and selecting and outputting by the tester synchronous circuit a test result from the test execution circuit. In this method, when performing the test of the test target circuit, the test is repeated the number of times determined by the first clock and the second clock, and when selecting a test result, a test result is selected so as to output all test results from the test execution circuit. This method allows performing testing for all clock cycles without lowering the operation clock frequency.

According to still another aspect of the present invention, there is provided a circuit test method for testing a test target circuit by a test execution circuit, a tester synchronous counter, and a clock generator, including supplying a clock from the clock generator to the test target circuit and the test execution circuit; performing by the test execution circuit a test of the test target circuit and outputting a test result to the tester synchronous circuit; and selecting and outputting by the tester synchronous circuit a test result from the test execution circuit. In this method, when performing the test of the test target circuit, the test is repeated the number of times determined by the clock of the test execution circuit and a clock of a tester to which the test result is output, and when selecting and outputting a test result, a test result is selected so as to output all test results from the test execution circuit. This method allows performing testing for all clock cycles without lowering the operation clock frequency.

The present invention provides a test circuit and a circuit test method which can perform testing for all clock cycles without lowering the operation clock frequency.

BRIEF DESCRIPTION OF THE DRAWINGS

The above and other objects, advantages and features of the present invention will be more apparent from the following description taken in conjunction with the accompanying drawings, in which:

FIG. 3 is a table showing the correspondence among an operation clock cycle, a test result, and the output of the test result from a test circuit according to the invention;

FIGS. 4A, 4B, and 4C are tables showing the correspondence among an operation clock cycle, a test result, and the output of the test result from a test circuit according to the invention;

FIG. 6A, 6B, and 6C are tables showing the correspondence among an operation clock cycle, a test result, and the output of the test result from a test circuit according to the invention;

FIG. 9 is a table showing the correspondence among an operation clock cycle, a test result, and the output of the test result from a test circuit according to the invention.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
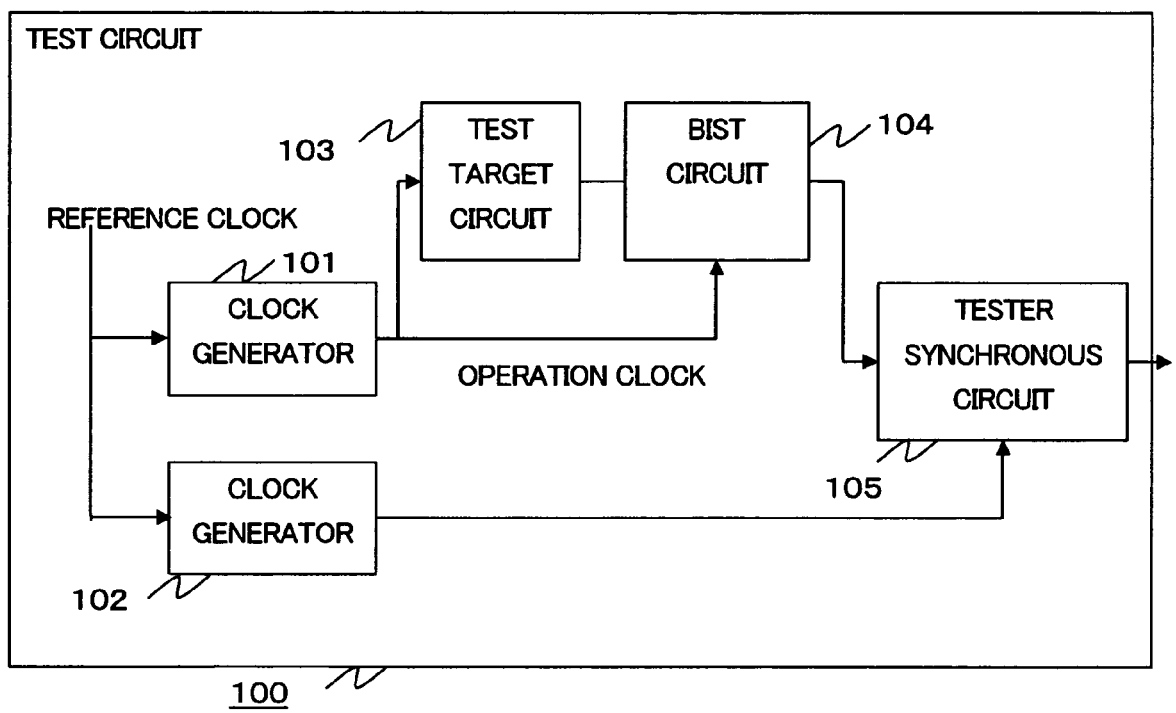
FIG. 1 is a block diagram illustrating the entire configuration of a test circuit according to the invention.

FIG. 1 illustrates an example of the configuration of a test circuit according to a first embodiment of the present invention. The test circuit 100 includes a clock generator 101, a clock generator 102, a test target circuit 103, a built-in self-test (BIST) circuit 104, and a tester synchronous circuit 105.

The clock generator 101 generates a clock frequency for the test target circuit 103 and the BIST circuit 104 based on a reference clock. The clock generator 102 generates a clock frequency for the tester synchronous circuit 105 based oh a reference clock. This reference clock may be the same as or different from the reference clock of the clock generator 101. The clock generated by the clock generator 102 is the clock frequency of a tester connected to the tester synchronous circuit 105. The clock frequency of the tester is generally lower than the clock frequency of the tester target circuit 103.

The test target circuit 103 is a circuit to be tested by the BIST circuit 104, and it operates according to the clock generated by the clock generator 101. The BIST circuit 104 performs a test of the test target circuit 103, and it also operates according to the clock generated by the clock generator 101. The test result is transmitted to the tester synchronous circuit 105.

The tester synchronous circuit 105 outputs the test result transmitted from the test target circuit 103, and it operates according to the clock generated by the clock generator 102. If the clock frequency generated by the clock generator 102 is one-third of the operation clock frequency, for example, the tester synchronous circuit 105 outputs the test result once in three times.

Referring next to the flowchart of FIG. 2, a process for determining a tester observation interval and the number of additional dummy clock cycles is described below.

Figure 2:
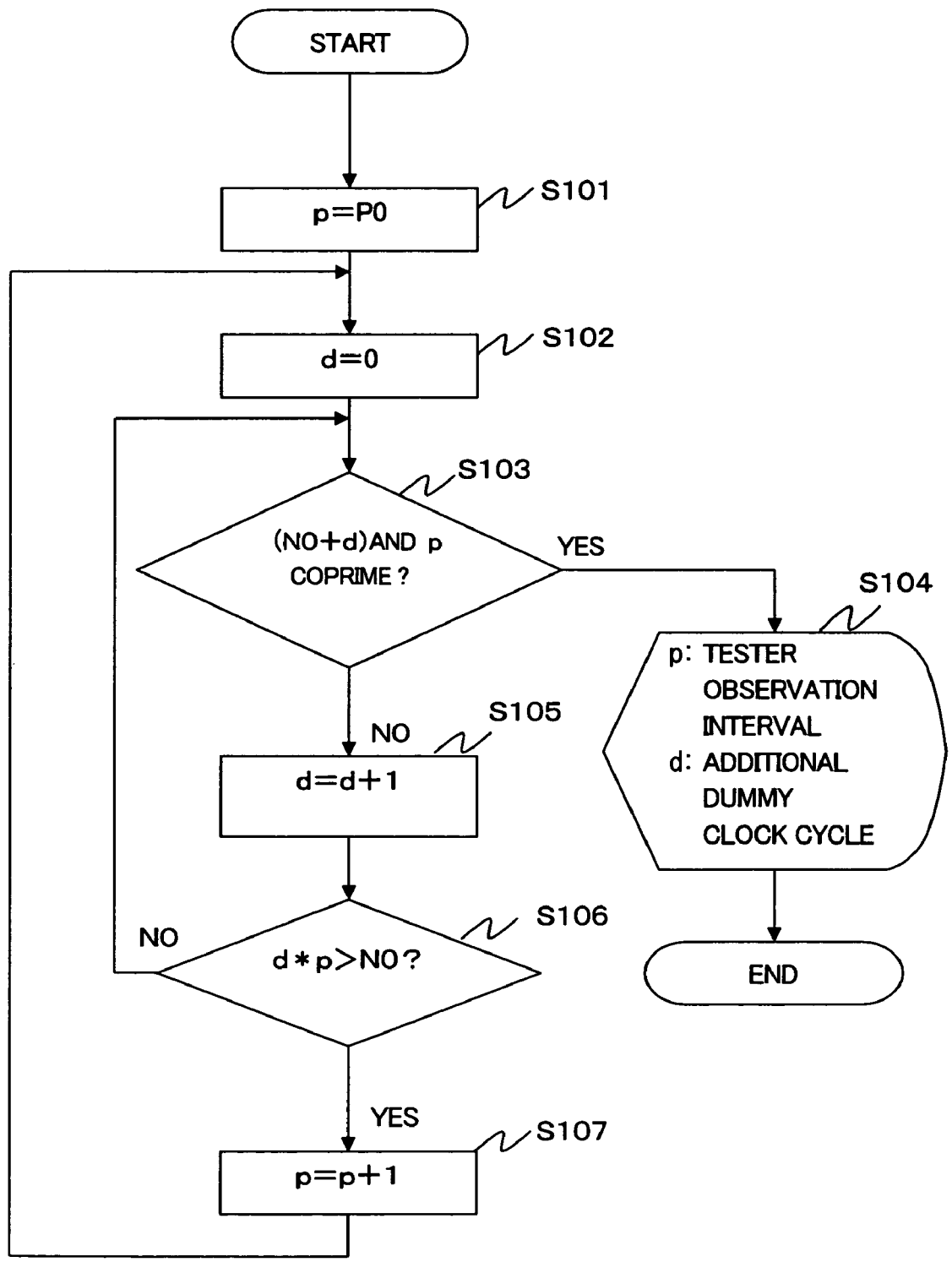
FIG. 2 is a flowchart showing a process for determining a tester observation interval and the number of additional dummy clock cycles according to the invention.

In FIG. 2, "P0" represents the operation clock frequency divided by the tester clock frequency, and "N0" represents the number of clock cycles of a test pattern. "p" represents a tester observation interval, and "d" represents an additional dummy clock. The following process aims to find out suitable values for p and d after setting initial values p=P0 (S101) and d=0 (S102).

The process first determines if the N0+d and p are coprime to each other (S103). If they are coprime, this value of p is determined to be a tester observation interval and this value of d is determined to be an additional dummy clock (S104). If they are not coprime, d is incremented by 1 (S105). Then, the process determines if the value of d*p is greater than N0 (S106). If d*p is greater than N0, p is incremented by 1 (S107), d is initialized to 0, and the process again determines if the N0+d and p are coprime to each other. On the other hand, if d*p is not greater than N0, the process determines if N0+d and p are coprime to each other with d left incremented by 1. This process is repeated until the values of N0+d and p become coprime to each other, thereby determining the tester observation interval and the number of additional dummy clocks.

The above process is described with specific numerical values. In the following example, the number of clock cycles is 128, the operation clock frequency is 300 Mhz, the tester clock frequency is 100 Mhz, and a failure occurs when the clock cycle is 2 and 7 as shown in the table of FIG. 3. Thus, P0 is 300/100=3, and N0 is 128. Initial values are p=3 and d=0. Since N0+d=128, and 128 and 3 are coprime to each other, the tester observation interval is determined to be 3, and the additional dummy clock cycle is determined to be 0. In actual testing with these values, the observable clock is 0, 3, 6, . . . , 123, 126 as shown in the table of FIG. 3. This process is repeated three times. Since the first clock in the second testing is 126+3=129 and the clock cycle is 128, the observable clock is 1, 4, 7, . . . , 121, 124, 127 as shown in the table of FIG. 4B. Similarly, in the third testing shown in the table of FIG. 4C, the observable clock is 2, 5, 8, . . . , 119, 122, 125. In this way, it is possible to test the circuit in all the clock cycles from 0 to 128 without lowering the operation clock frequency.

In another example, the number of clock cycles is 128, the operation clock frequency is 200 Mhz, the tester clock frequency is 100 Mhz. Thus, P0 is 200/100=2, and N0 is 128. Initial values are p=2 and d=0. In this case, N0+d=128, and 128 and 2 are not coprime. Thus, d is incremented by 1 and thus d=1. Since d*p=2, which is smaller than N0, it is determined whether N0+d and p are coprime with these values. N0+d=129 and p=2, and 129 and 2 are coprime to each other. The tester observation interval is thereby determined to be 2, and the additional dummy clock cycle is determined to be 1. In actual testing with these values, the observable clock is 0, 2, 4, . . . , 124, 126. In the second testing, the observable clock is 1, 3, 5, . . . , 125, 127. In this way, it is possible to test the circuit in all the clock cycles from 0 to 128 without lowering the operation clock frequency.

The circuit test method of this invention allows observation of all the clock cycles as follows. The number of patterns is "N", and the tester observation interval is "P". N and P are each an integer greater than 0. All the clock cycles are observable by repeating the test P times on the condition that the integers i and j which satisfy $iN \equiv jN \pmod{P}$ and $P > j > i >= 0$ do not exist. The algorism for checking the absence of the integers i and j satisfying the above condition is $O(n^2)$. Even if a given integer C is subtracted from both sides of the above formula $iN \equiv jN \pmod{P}$, the same remainder is left when divided by P; in other words, it is congruent to modulo P. Thus, $iN - C \equiv jN - C \pmod{P}$.

If C=N, $iN - N \equiv jN - N \pmod{P}$. Thus, $(i-1)N \equiv (j-1)N \pmod{P}$ Repeating the subtraction of N from both sides results in $0 \equiv (j-N) \pmod{P}$. If $k=j-i$, $P>(j-i)>0$. Thus, $0 \equiv kN \pmod{P}$ and $P>k>0$. Therefore, the condition for observing all the clock cycles by repeating the test P times is that the integer k which satisfies $0 \equiv kN \pmod{P}$ and $P>k>0$ does not exist. Absence of k satisfying this condition means that any of N, 2N, 3N, ..., (P−1)N is not dividable by P. The algorism for checking this is O(n).

Since N, 2N, 3N, ..., (P−1)N are multiples of N, if any of these is not dividable by P and thus not a multiple of P, the least common multiple of P and N is PN. This means that P and N are coprime to each other. Euclidean algorithm may be used in this process, and Euclidean algorithm is O(log n). Therefore, the algorithm of O(log n) allows observing all the clock cycles.

Second Embodiment

Figure 5:
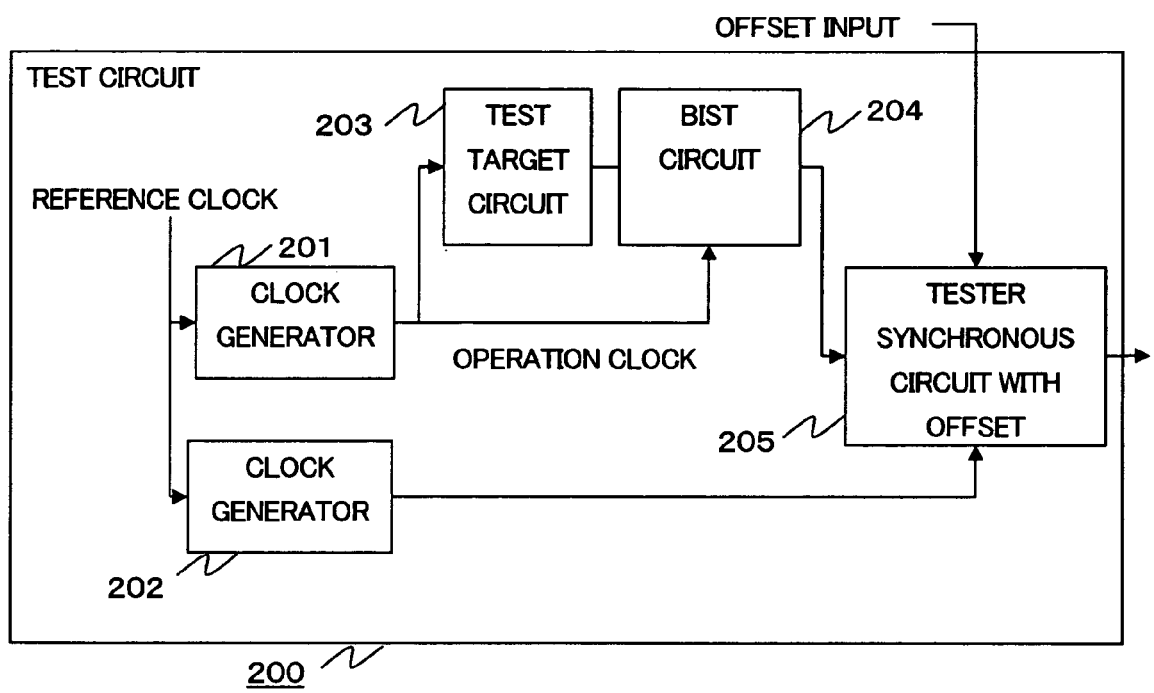
FIG. 5 is a block diagram illustrating the entire configuration of a test circuit according to the invention.

A second embodiment uses a tester synchronous circuit with offset. FIG. 5 shows an example of the configuration of a test circuit according to the second embodiment of the invention. The test circuit 200 includes a clock generator 201, a clock generator 202, a test target circuit 203, a BIST circuit 204, and a tester synchronous circuit 205 with offset.

The clock generator 201 generates a clock frequency for the test target circuit 203 and the BIST circuit 204 based on a reference clock. The clock generator 202 generates a clock frequency for the tester synchronous circuit 205 with offset based on a reference clock. This reference clock may be the same as or different from the reference clock of the clock generator 201. The clock generated by the clock generator 202 is the clock frequency of a tester connected to the tester synchronous circuit 105. The clock frequency of the tester is generally lower than the clock frequency of the tester target circuit 203.

The test target circuit 203 is a circuit to be tested by the BIST circuit 204, and it operates according to the clock generated by the clock generator 201. The BIST circuit 204 performs a test of the test target circuit 203, and it also operates according to the clock generated by the clock generator 201. The test result is transmitted to the tester synchronous circuit 205 with offset.

The tester synchronous circuit 205 with offset outputs the test result transmitted from the test target circuit 203, and it operates according to the clock generated by the clock generator 202. If the clock frequency generated by the clock generator 202 is one-third of the operation clock frequency, for example, the tester synchronous circuit 205 outputs the test result once in three times. Further, the tester synchronous circuit 205 with offset receives an offset value and shifts the operation clock based on the received offset value.

The operation of the tester synchronous circuit 205 with offset is described hereafter. In this example, the tester clock frequency is one-third of the operation clock frequency, that is, the operation clock frequency is 300 Mhz and the tester clock frequency is 100 Mhz for instance. If the offset input value is 1, the tester synchronous circuit 205 outputs a test result at the clock cycle 1, 4, 7 . . . and so on as shown in FIG. 6B. Similarly, in order to output a test result at the clock cycle 0, 3, 6, . . . and so on, the offset value is set to 0 as shown in FIG. 6A. To output a test result at the clock cycle 2, 5, 8, . . . and so on, the offset value is set to 2 as shown in FIG. 6C.

In this way, input of a different offset value allows testing in all the clock cycles without lowering the operation clock frequency even if the tester clock frequency is lower than the operation clock frequency.

Third Embodiment

Figure 7:
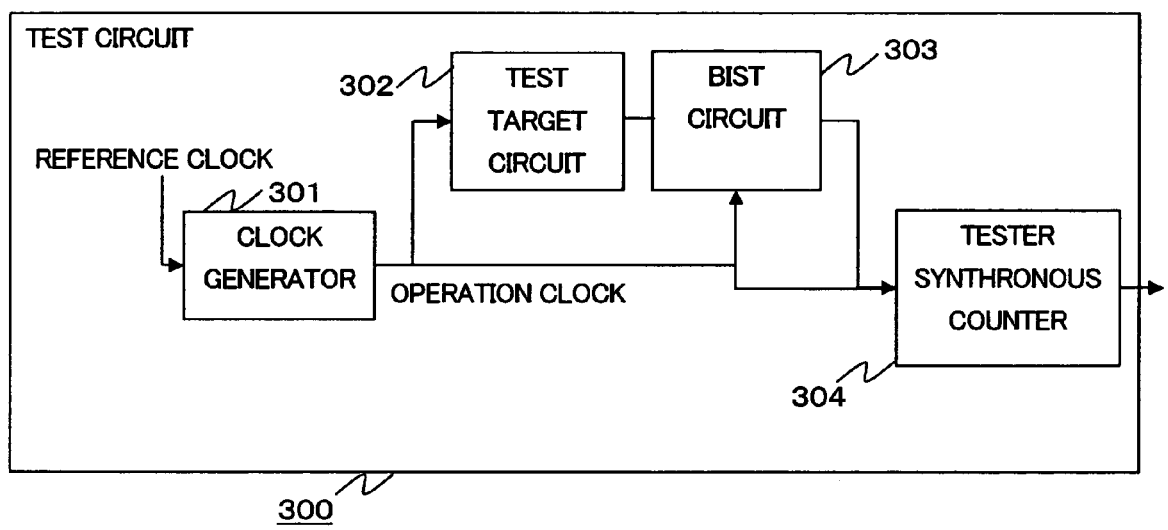
FIG. 7 is a block diagram illustrating the entire configuration of a test circuit according to the invention.

A third embodiment uses a tester synchronous counter. FIG. 7 shows an example of the configuration of a test circuit according to the third embodiment of the invention. The test circuit 300 includes a clock generator 301, a test target circuit 302, a BIST circuit 303, and a tester synchronous counter 304.

The clock generator 301 generates a clock frequency for the test target circuit 302, the BIST circuit 303 and the tester synchronous counter 304 based on a reference clock.

The test target circuit 302 is a circuit to be tested by the BIST circuit 303, and it operates according to the clock generated by the clock generator 301. The BIST circuit 303 performs a test of the test target circuit 302, and it also operates according to the clock generated by the clock generator 301. The test result is transmitted to the tester synchronous counter 304.

The tester synchronous counter 304 includes a counter which counts a tester observation interval and outputs the test result transmitted from the BIST circuit 303 according to the count number. The tester synchronous counter 304 operates according to the clock generated by the clock generator 301, which is the same clock as the clock for the test target circuit 302 and the BIST circuit 303. Since the tester synchronous counter 304 outputs the test result according to the count number, it is compatible with the case where a tester connected to the tester synchronous counter 304 operates at a lower clock frequency.

The operation of the tester synchronous counter 304 is described hereafter. In this example, the tester clock frequency is one-fourth of the operation clock frequency; for instance, the operation clock frequency is 400 Mhz and the tester clock frequency is 100 Mhz. The tester synchronous counter 304 increments the counter value each time it receives the test result from the BIST circuit 303, and initializes the value to 0 after the counter number reaches 4. Specifically, the counter value changes like: 0, 1, 2, 3, 0, 1, 2, 3, 0 . . . and so on. The tester synchronous counter 304 transmits the test result to a tester only when the counter value is 0, which enables synchronization when the tester clock frequency is one-fourth of the operation clock frequency. Further, the tester synchronous counter 304 transmits the test result when the counter value is 1, then when the counter value is 2, and finally when the counter value is 3, thereby outputting the test results in all the clock frequencies.

In this way, use of the counter allows testing in all the clock cycles without lowering the operation clock frequency even if the tester clock frequency is lower than the operation clock frequency.

Fourth Embodiment

Though the three embodiments described above allow identifying in which clock cycle a failure has occurred, it is necessary to perform a test a plurality of times and thus requires a long test time. For the test with a low failure rate, the efficiency of the test increases if it is possible to quickly determine whether the failure occurs or not. The fourth embodiment allows checking the occurrence of a failure with one-time testing.

Figure 8:
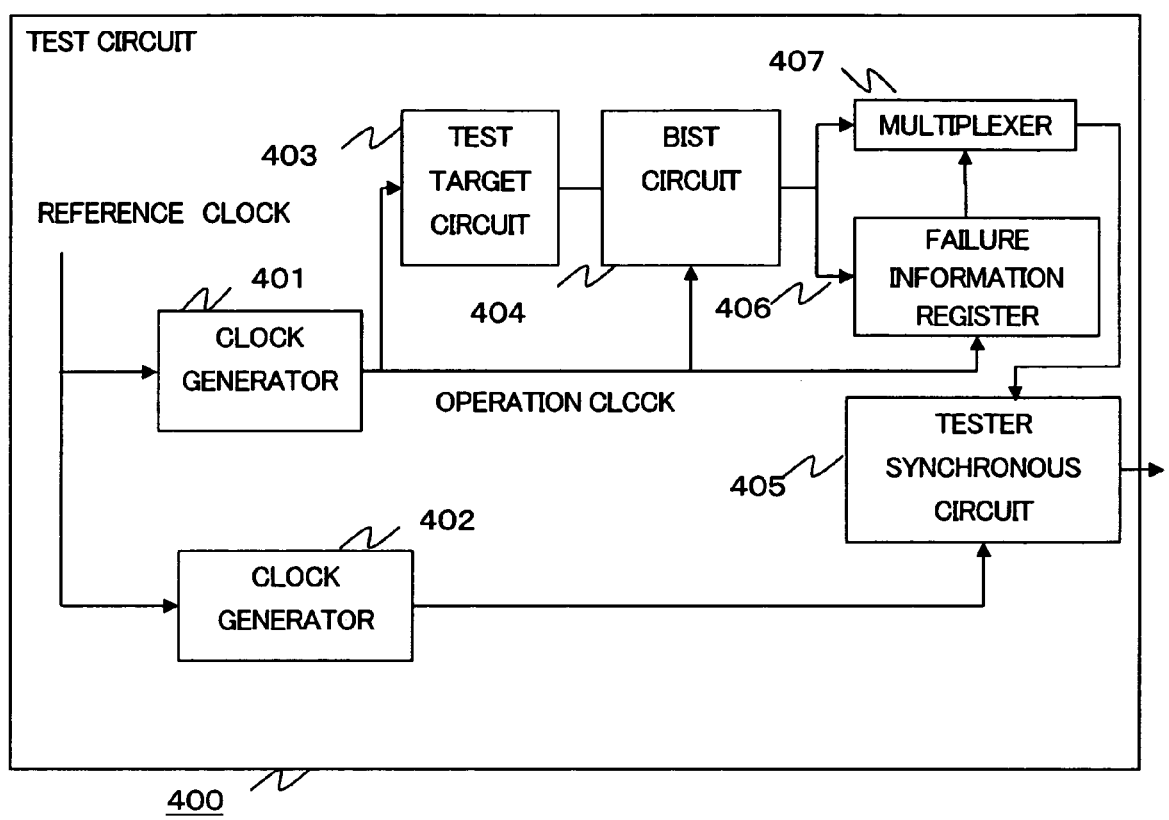
FIG. 8 is a block diagram illustrating the entire configuration of a test circuit according to the invention.

FIG. 8 shows an example of the configuration of a test circuit according to the fourth embodiment of the invention. The test circuit 400 includes a clock generator 401, a clock generator 402, a test target circuit 403, a BIST circuit 404, and a tester synchronous circuit 405. These elements are the same as those illustrated in FIGS. 1 and 5, and thus not described here. The test circuit 400 further includes a failure information register 406 and a multiplexer 407.

The failure information register 406 stores test results transmitted from the BIST circuit 404. It is connected to the clock generator 401, the BIST circuit 404, and the multiplexer 407. The failure information register 406 receives a test result from the BIST circuit 404 and transmits the result to the multiplexer 407.

The multiplexer 407 is an electrical circuit that combines divided signals and outputs the combined signal. It is connected to the BIST circuit 404 and the failure information register 406. The multiplexer 407 receives a test result and a test end signal from the BIST circuit 404.

The operation of the BIST circuit 404, the failure information register 406, and the multiplexer 407 is described hereafter. The BIST circuit 404 performs a test of the test target circuit 403 and transmits a test result to the failure information register 406 and the multiplexer 407. Once storing failure information, the failure information register 406 keeps storing the failure information. For example, with 0 representing success and 1 representing failure, the failure information register 406 may OR the present value and the value transmitted from the BIST circuit 404 and stores the OR operation result as a new register value.

The multiplexer 407 receives test result information and a test end signal indicating if the test completes from the BIST circuit 404. If the test end signal indicates that the test does not end, the multiplexer 407 transmits the test result information from the BIST circuit 404 to the tester synchronous circuit 405. On the other hand, if the test end signal indicates that the test ends, the multiplexer 407 receives failure information from the failure information register 406 and transmits this information to the tester synchronous circuit 405. The output result is as shown in the table of FIG. 9, for example. Once failure information is output from the failure information register 406, failure information is kept output in each cycle after that.

In this way, one-time testing can tell if the test is failed or not. After the failure is detected, the first or the second embodiment of the invention may be applied in order to identify in which clock cycle the failure has occurred.

Another Embodiment

Though the above embodiments use a BIST circuit, which incorporates a circuit to be tested into a test circuit, the circuit to be tested may be connected externally.

It is apparent that the present invention is not limited to the above embodiment that may be modified and changed without departing from the scope and spirit of the invention.

What is claimed is:

1. A test circuit for testing a test target circuit and outputting a test result to a tester, comprising:
    a test target circuit;
    a built-in self-test circuit connected to the test target circuit and performing a test of the test target circuit;
    a first clock generator supplying a first clock to the test target circuit and the built-in self-test circuit;
    a tester synchronous circuit receiving a test result from the built-in self-test circuit and outputting the test result in synchronization with the tester; and
    a second clock generator supplying a second clock with a lower frequency than the first clock to the tester synchronous circuit, wherein
    the built-in self-test circuit repeats the test the number of times determined by the first clock and the second clock, and
    the tester synchronous circuit selects and outputs a test result so as to output all test results from the built-in self-test circuit.

2. The test circuit of claim 1, wherein the tester synchronous circuit includes an offset value input unit and selects a test result according to an offset value output from the offset value input unit.

3. The test circuit of claim 1, further comprising;
    a register storing information indicating whether a test result transmitted from the built-in self-test circuit includes a failure; and
    a multiplexer receiving a test result and an end signal from the built-in self-test circuit, selecting one from the test result and the information stored in the register according to the end signal, and transmitting the selected one to the tester synchronous circuit.

4. A test circuit for testing a test target circuit and outputting a test result to a tester, comprising:
    a test target circuit;
    a built-in self-test circuit connected to the test target circuit and performing a test of the test target circuit;
    a clock generator supplying a clock to the test target circuit and the built-in self-test circuit; and
    a tester synchronous counter counting the clock supplied from the clock generator and selecting and outputting a test result so as to output all test results from the built-in self-test circuit,
    wherein the built-in self-test circuit repeats the test the number of times determined by the clock of the built-in self-test circuit and a clock of the tester.

5. The test circuit of claim 4, further comprising;
    a register storing information indicating whether a test result transmitted from the built-in self-test circuit includes a failure; and
    a multiplexer receiving a test result and an end signal from the built-in self-test circuit, selecting one from the test result and the information stored in the register according to the end signal, and transmitting the selected one to the tester synchronous circuit.

6. A circuit test method for testing a test target circuit, comprising:
    supplying a first clock from a first clock generator to a test target circuit and a test execution circuit;
    supplying a second clock with a lower frequency than the first clock from a second clock generator to a tester synchronous circuit;
    performing by the test execution circuit a test of the test target circuit and outputting a test result to the tester synchronous circuit; and
    selecting and outputting by the tester synchronous circuit a test result from the test execution circuit, wherein
    when performing the test of the test target circuit, the test is repeated the number of times determined by the first clock and the second clock, and
    when selecting a test result, a test result is selected so as to output all test results from the test execution circuit.

7. The circuit test method of claim 6, wherein
    the test execution circuit is a built-in self-test circuit, and
    the test target circuit, the test execution circuit, the tester synchronization circuit, the first clock generator, and the second clock generator are formed in one semiconductor chip.

8. The circuit test method of claim 6, wherein the number of repeating tests and the selection of a test result by the tester synchronous circuit are determined by a process comprising:
- (a) inputting a tester observation interval value with an initial value of a frequency of the first clock divided by a frequency of the second clock;
- (b) inputting the number of additional dummy clock cycles with an initial value of 0;
- (c) determining if a sum of the number of clock cycles of the test target circuit and the number of additional dummy clock cycles is coprime to the tester observation interval value;
- (d) if (c) determines a relation being coprime, determining present values of the tester observation interval value and the number of additional dummy clock cycles to be final values, and determining the number of repeating tests and the selection of a test result by the tester synchronous circuit based on the determined tester observation interval value and the determined number of additional dummy clock cycles;
- (e) if (c) determines a relation not being coprime, incrementing the number of additional dummy clock cycles by 1 and determining if a product of the number of additional dummy clock cycles incremented by 1 and the tester observation interval value is greater than the number of clock cycles of the test target circuit; and
- (f) if (e) determines the product being greater, incrementing the tester observation interval value by 1 and returning to (b); if (e) determines the product not being greater, returning to (c).

9. The circuit test method of claim 8, wherein
the test execution circuit is a built-in self-test circuit, and
the test target circuit, the test execution circuit, the tester synchronization circuit, the first clock generator, and the second clock generator are formed in one semiconductor chip.

10. The circuit test method of claim 6, wherein a test result is selected by the tester synchronous circuit according to an input offset value.

11. The circuit test method of claim 10, wherein
the test execution circuit is a built-in self-test circuit, and
the test target circuit, the test execution circuit, the tester synchronization circuit, the first clock generator, and the second clock generator are formed in one semiconductor chip.

12. A circuit test method for testing a test target circuit by a test execution circuit, a tester synchronous counter, and a clock generator, the method comprising:

supplying a clock from the clock generator to the test target circuit and the test execution circuit;

performing by the test execution circuit a test of the test target circuit and outputting a test result to the tester synchronous circuit; and selecting and outputting by the tester synchronous circuit a test result from the test execution circuit, wherein when performing the test of the test target circuit, the test is repeated the number of times determined by the clock of the test execution circuit and a clock of a tester to which the test result is output, and when selecting and outputting a test result, a test result is selected so as to output all test results from the test execution circuit.

13. The circuit test method of claim 12, wherein
the test execution circuit is a built-in self-test circuit, and
the test target circuit, the test execution circuit, the tester synchronization circuit, the first clock generator, and the second clock generator are formed in one semiconductor chip.

* * * * *